United States Patent [19]
Yamaguchi

[11] Patent Number: 5,313,122
[45] Date of Patent: May 17, 1994

[54] CAPACITY GROUND TYPE FILTER CIRCUIT

[75] Inventor: Futao Yamaguchi, Kanagawa, Japan

[73] Assignee: Sony Corporation, Japan

[21] Appl. No.: 52,451

[22] Filed: Apr. 26, 1993

Related U.S. Application Data

[63] Continuation of Ser. No. 858,006, Mar. 26, 1992, abandoned.

[30] Foreign Application Priority Data

Mar. 31, 1991 [JP] Japan .................. 3-093600

[51] Int. Cl.⁵ .................. H03K 9/06; H03K 5/00; G06G 7/00; G06G 7/12
[52] U.S. Cl. .................. 307/520; 307/529; 307/542; 307/359; 307/494; 328/127; 328/165; 328/167
[58] Field of Search .............. 307/529, 359, 494, 520, 307/542; 328/127, 133, 109, 165, 167

[56] References Cited

U.S. PATENT DOCUMENTS

| | | | |
|---|---|---|---|
| 3,697,881 | 10/1972 | Nakagome et al. | 328/109 |
| 4,430,626 | 2/1984 | Adams | 328/127 |
| 4,527,277 | 7/1985 | Kosaka et al. | 328/133 |
| 4,625,131 | 11/1986 | Kasperkovitz et al. | 307/494 |
| 4,626,795 | 12/1986 | Tanaka et al. | 330/257 |
| 4,893,088 | 1/1990 | Myers et al. | 328/127 |
| 5,051,628 | 9/1991 | Hanna | 328/127 |
| 5,053,639 | 10/1991 | Taylor | 307/359 |
| 5,081,372 | 1/1992 | Pelgrom | 307/359 |
| 5,140,185 | 8/1992 | Lietar | 307/494 |
| 5,192,884 | 3/1993 | Kusano | 307/520 |

Primary Examiner—William L. Sikes
Assistant Examiner—Trong Phan
Attorney, Agent, or Firm—Ronald P. Kananen

[57] ABSTRACT

In a filter circuit of a capacity ground type in which the capacitance connected to output terminals of integrators is grounded, output signals are fed back from multiple stages of integrators to respective input stages of a subtracter which constitute a differential couple with input stages of the first stage integrator, and in the subtracter input signals are subtracted by fed back signals of the multiple stages and are then outputted. It is thereby capable to constitute a high-pass filter in a filter circuit of the capacity ground type with ease.

15 Claims, 6 Drawing Sheets

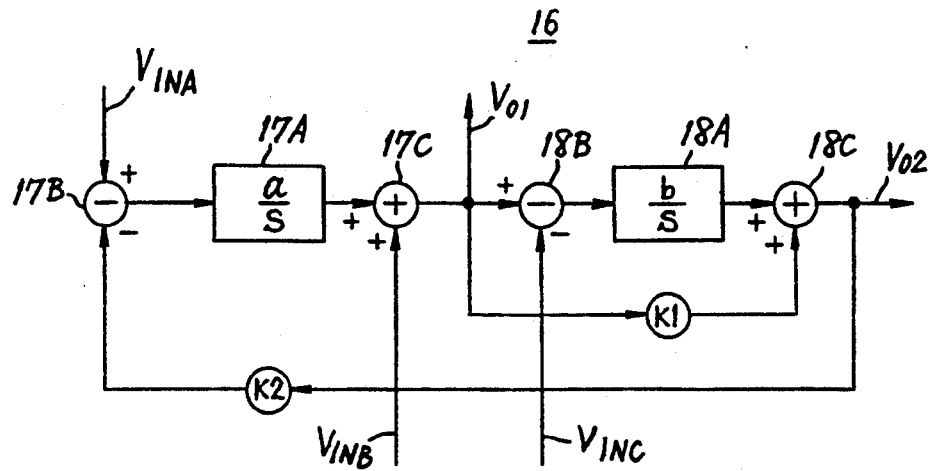

FIG. 6 (PRIOR ART)

| | | TRANSMITTANCE $V_{01}/V_{INA}$ | TRANSMITTANCE $V_{02}/V_{INA}$ |
|---|---|---|---|
| FEEDBACK SECONDARY FILTER | $K_1, K_2 \neq 1$ | $\dfrac{S/K_2b + K_1/K_2}{S^2/K_2ab + SK_1/K_2a + 1}$ | $\dfrac{1/K_2}{S^2/K_2ab + SK_1/K_2a + 1}$ |
| | $K_1, K_2 = 1$ | $\dfrac{S/b}{S^2/ab + S/a + 1}$ | $\dfrac{1}{S^2/ab + S/a + 1}$ |
| FEEDFORWARD SECONDARY FILTER | $K_1, K_2 \neq 1$ | $\dfrac{S/K_2b}{S^2/K_2ab + SK_1/b + 1}$ | $\dfrac{SK_1/K_2b + 1/K_2}{S^2/K_2ab + SK_1/b + 1}$ |
| | $K_1, K_2 = 1$ | $\dfrac{S/b}{S^2/ab + S/b + 1}$ | $\dfrac{S/b + 1}{S^2/ab + S/b + 1}$ |

FIG. 7 (PRIOR ART)

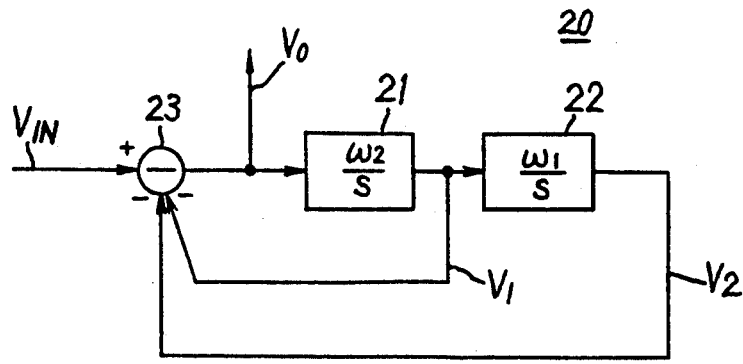
FIG. 9
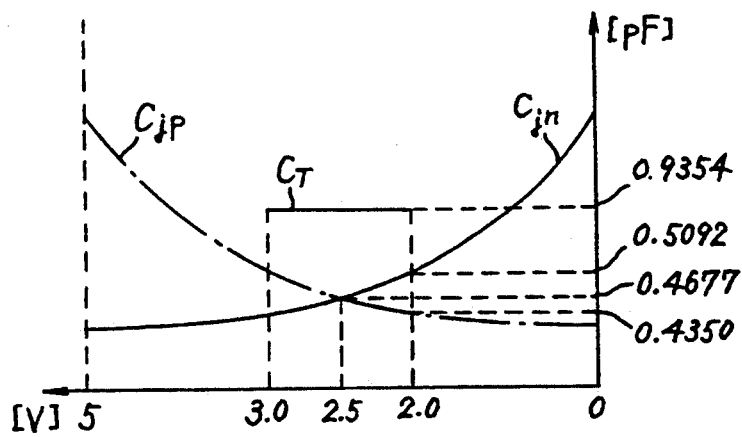
FIG. 10
| $V_R$ [V] | $C_{jP}$[pF] | $C_{jN}$[pF] | $C_T$[pF] | NORMALIZED |
|---|---|---|---|---|
| 2.0 | 0.5092 | 0.4350 | 0.9442 | 1.0094 |
| 2.5 | 0.4677 | 0.4677 | 0.9354 | 1.0000 |
| 3.0 | 0.4350 | 0.5092 | 0.9442 | 1.0094 |
FIG. 11

CAPACITY GROUND TYPE FILTER CIRCUIT

This application is a continuation of application Ser. No. 07/858,006 filed Mar. 26, 1992, now abandoned.

BACKGROUND OF THE INVENTION

This invention relates to a filter circuit, and is more particularly suitably applied to a filter circuit of a capacity grounded type.

In conventional filter circuits which are constituted by combining transistors, capacitances and resistances, there are filter circuits (that is, multiple input-one output type filters) which are desirably constructed by inputting input signals to one of the input terminals.

As illustrated in FIG. 1, such a filter circuit 1 is constituted by two stage mutual conductance variable type operational amplifiers 2 and 3 and a buffer 4. Input signals $V_{INL}$ are inputted to a non-inverting input terminal of the operational amplifier 2, input signals $V_{INB}$ and $V_{INH}$ are inputted to non-inverting input terminal of the operational amplifier 3 and the input terminal of the buffer 4 through condensers C2 and C1, respectively, and then are outputted as output signals $V_0$ from the buffer 4.

The output signals $V_0$ are fed back to the inverting input terminals of the operational amplifiers 2 and 3.

This filter circuit 1 may be represented by an equivalent circuit as shown in FIG. 2 by indicating the operational amplifier 5 and the output side condenser C3 (FIG. 3A) by an integrator 5A, an input side subtracter 5B, and an output side adder 5C (FIG. 3B) as illustrated in FIG. 3.

Here, the transmission function of the output signals $V_0$ can be expressed by the following equation, using input signals $V_{INL}$, $V_{INB}$ and $V_{INH}$:

$$V_0 = \frac{s^2 \cdot V_{INH} + (\omega_0/Q)s \cdot V_{INB} + \omega_0^2 V_{INL}}{s^2 + (\omega_0/Q)S + \omega_0^2} \quad (1)$$

Here, using angular frequencies $\omega_1$ and $\omega_2$ of the first and second operational amplifiers 2 and 3, $\omega_0$ and Q may be given by the following equation:

$$\omega_0^2 = \omega_1 \cdot \omega_2 \quad (2)$$

$$Q = \sqrt{\omega_1/\omega_2} \quad (3)$$

Using mutual conductance $g_1$ and $g_2$ of the first and second operational amplifiers 2 and 3, angular frequencies $\omega_1$ and $\omega_2$ are given by the following equations:

$$\omega_1 = g_1/C_1 \quad (4)$$

$$\omega_2 = g_2/C_2 \quad (5)$$

More specifically, the filter circuit 1 constitutes a low-pass filter as shown in the following equation:

$$\frac{V_0}{V_{INL}} = \frac{\omega_0^2}{s^2 + (\omega_0/Q)s + \omega_0^2} \quad (6)$$

in the case where only input signals $V_{INL}$ are inputted (hereinafter referred to as capacity ground). This occurs when in Eq. (1), $V_{INB} = V_{INH} = 0$. On the other hand, the filter circuit 1 may constitute a high-pass filter as shown in the following equation:

$$\frac{V_0}{V_{INH}} = \frac{s^2}{s^2 + (\omega_0/Q)s + \omega_0^2} \quad (7)$$

This occurs when input signals are inputted through condensers (C2 and C1) (hereinafter referred as floating input). This may occur, for example, only when input signals $V_{INH}$ are inputted, that is, when in Eq. (1), $V_{INL} = V_{INB} = 0$.

In such a filter circuit 1, only the low-pass filter can be however constituted by the capacity ground input since it is not possible to apply is to a case where high-pass filter is designed using a capacity ground input filter.

Although it might be possible to constitute a filter circuit using one input multiple output type filter circuit (FIG. 4) and multiple input-multiple output type filter circuit (FIGS. 5 and 6), but in either case, it is not possible to constitute a high-pass filter with a simple configuration according to the capacity ground input.

More specifically, in the case of one input-multiple output circuit 10, output signals $V_{01}$, which are outputted through the first and second integrators 11A and 12A, and output signals $V_{03}$, which are outputted only through the first integrator 11A, constitute a low-pass filter and a band-pass filter in transmittance, respectively. Output signals $V_{02}$ which are outputted through the first subtracter 11B can only a high-pass filter including a first order term in the numerator of Eq. (7).

In the cases of a feedback type secondary filter 13 (FIG. 5) and a feedforward type secondary filter 16 (FIG. 6) which constitute multiple input-multiple output type filter circuits, it is not possible for output signals $V_{01}$ and $V_{02}$ which are outputted from the first and second output terminals on the basis of input signals $V_{INA}$ to constitute high-pass filters as shown in FIG. 7.

SUMMARY OF THE INVENTION

In view of the foregoing, an object of this invention is to provide a filter circuit which is capable of constituting a capacity grounded type high-pass filter with a simple configuration.

The foregoing object and other objects of the invention have been achieved by the provision of a filter circuit comprising: integrators 21 and 22 in the number of N ($N \geq 1$) which are differential amplification circuits and connected in series; and a subtracter 23 which is a differential amplification circuit and subtracts output signals $V_1$ and $V_2$, outputted from the integrators 21 and 22, from respective inputs $V_{INA}$ to output the result of the subtraction as a filter output $V_0$, a filter circuit in which the initial stage 21 of the integrators feedbacks respective output signals $V_1$ and $V_2$ through resistors R2 and R3 which have resistances NR N times as large as resistance R connected to non-inverting input side; and the input stages Q11 and Q12 of the subtracter 23 constitute a differential couple with input stages Q3 and Q5 of the first stage of the integrator 21.

A feedback output $\omega_2/s$ $V_{IN}$, outputted from the first stage of the integrator 21, and a feedback output $(\omega_1 \cdot \omega_2/s^2)$ $V_{IN}$, which has passed through the first and second stages of integrators 21 and 22, are fed back to the subtracter circuit 23, and are subtracted from an input signals $V_{IN}$ to output the result as an output signal $V_0$.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIG. 6 is a block diagram providing an illustration of a multiple input-multi output type filter circuit of feed forward type;

FIG. 7 is a table showing the transmittance;

FIG. 9 is an interconnection diagram illustrating the equivalent circuit of the filter circuit of the embodiment;

FIG. 10 is a characteristic curve graph showing a voltage characteristic of the parasitic capacitance;

FIG. 11 is a table showing voltage characteristic of the parasitic capacitance;

DETAILED DESCRIPTION OF THE INVENTION

Figure 1:
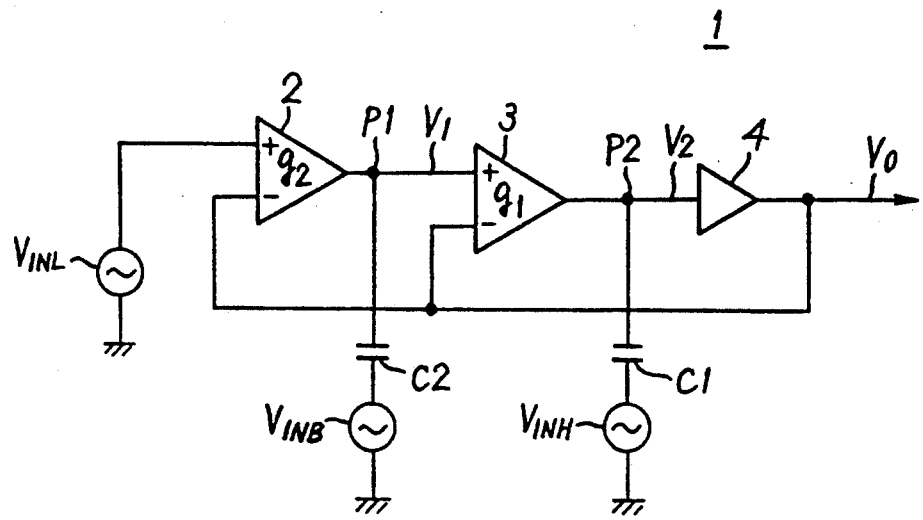
FIG. 1 is a block diagram providing an illustration of a filter circuit of multiple-input-one output type.
Figure 3A:
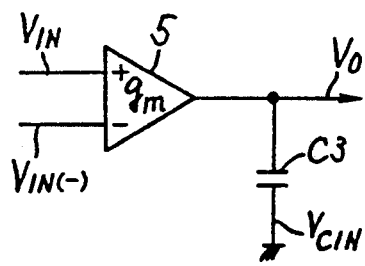
FIGS. 3A and 3B are equivalent circuit diagrams for illustrating the integrator.
Figure 3B:
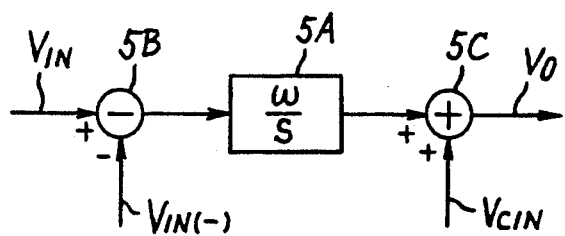
Figure 2:
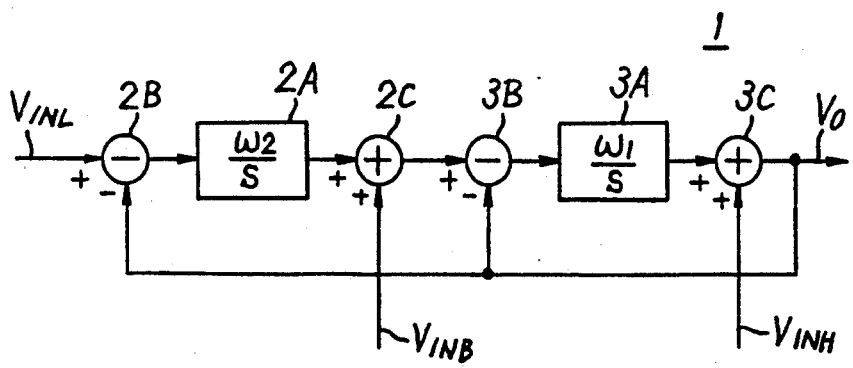
FIG. 2 is a block diagram illustrating an equivalent circuit of the filter circuit of multiple-input-one output type.
Figure 4:
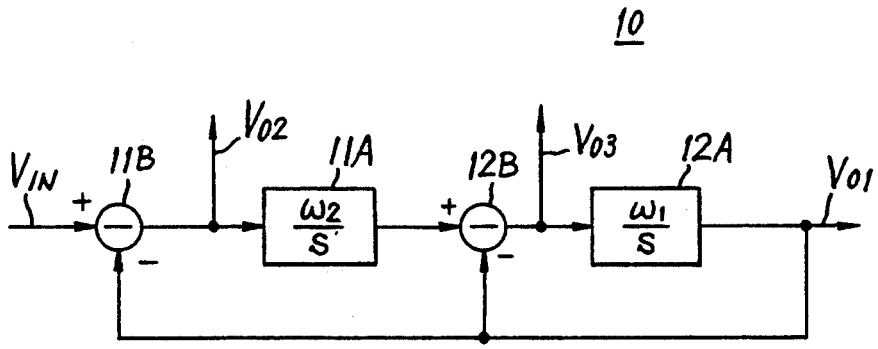
FIG. 4 is a block diagram for illustrating the filter circuit of one input-multiple output type.
Figure 5:
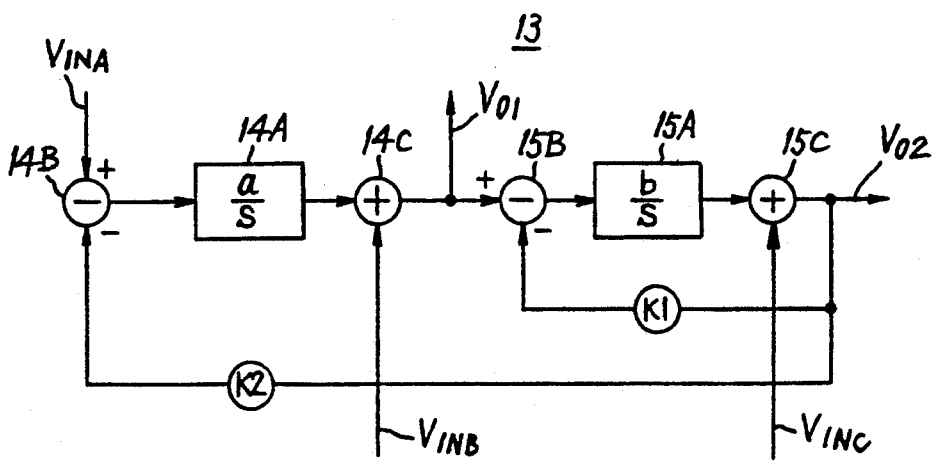
FIG. 5 is a block diagram providing an illustration of a multiple input-multi output type filter circuit of feed back type.
Figure 8:
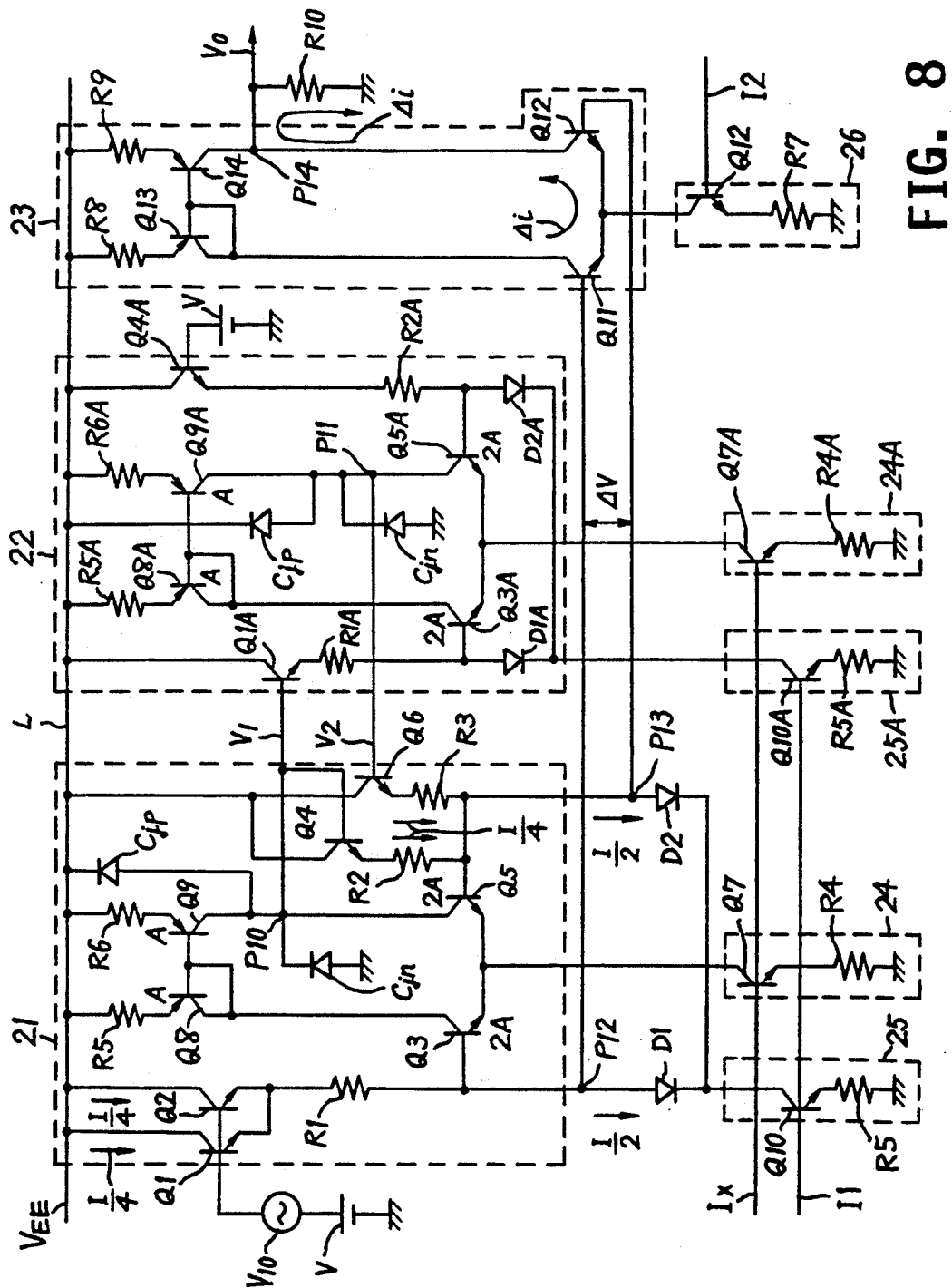
FIG. 8 is a block diagram showing the one embodiment of the filter circuit of the present invention.

Preferred embodiments of this invention will be described with reference to the accompanying drawings:

In FIG. 8, 20 generally designates a capacity ground type high-pass filter which is a two stage operational amplifier, and is constituted by an equivalent circuit as shown in FIG. 9.

The high-pass filter 20 includes two stages integrators 21 and 22, and outputs $V_1$ and $V_2$ of the first and second integrators 21 and 22 are fed back to the subtracter 23. The difference between the input signals $V_{IN}$ and the first and second outputs $V_1$ and $V_2$ is outputted as an output signal $V_0$.

The output signal $V_0$ of the high-pass filter 20 may be the following equation, using angular frequencies $\omega_1$ and $\omega_2$ of the integrators 21 and 22.

$$V_0 = V_{IN} - \frac{\omega_2}{s} \cdot V_0 - \frac{\omega_1 \cdot \omega_2}{s^2} \cdot V_0^2 \qquad (8)$$

Thus, the transmittance of the high-pass filter 20 shows a characteristic of an ideal high-pass filter as shown by the following equation:

$$\frac{V_0}{V_{IN}} = \frac{s^2}{s^2 + (\omega_0/Q)s + ab^2} \qquad (9)$$

Here, the first and second integrators 21 and 22 are constituted by current mirror type differential amplification circuits.

An input signal $V_{IN}$ is inputted to the base of a differential amplification transistor Q3 of the non-inverting input side through NPN transistors Q1 and Q2 and resistance R1, and is also inputted to a non-inverting input terminal of the subtracter 23 which constitutes a differential couple with the transistor Q3.

The differential output $V_1$ which is outputted from the first integrator 21 is outputted to the base of a differential amplification transistor Q5 of the inverting input side through an NPN transistor Q4 and a resistance R2.

Also, the differential output $V_2$, outputted from the second integrator 22, is inputted to the base of the transistor Q5 through an NPN transistor Q6 and a resistance R3.

The emitters of the differential amplification transistors Q3 and Q5 are interconnected, and are connected to a constant current source 24 which includes an NPN transistor Q7 and a resistance R4.

The collectors of transistors Q3 and Q5 are connected to the collectors of transistors Q8 and Q9 as active loads which are PNP transistors, respectively.

Here, the emitters of transistors Q8 and Q9 are interconnected to a power line L through resistances R5 and R6 for providing a source voltage $V_{EE}$. The bases of transistors Q8 and Q9 are connected to each other and are connected to the collector of transistor Q8.

Thus, the load transistor Q8 is diode connected.

The bases of the differential amplification transistors Q3 and Q5 are connected to each other through respective diodes D1 and D2 and are connected to a constant current source 25, which is constituted by an NPN transistor Q10 and a resistance R5.

Here, the resistances R2 and R3, which are connected in parallel to the inverting input side, has a resistance (2R) twice as large as the non-inverting input side resistance R1 so that no offset may be produced in the base voltages of the differential amplification transistors Q3 and Q5.

More specifically, a potential of $V_{EE} - (I \cdot R)/2$ is supplied to the base of the transistor Q3 by the current $I/2$ which flows through the resistance R1. A potential $V_{EE} - (2R \cdot I)/4$ is provided to the base of the transistor Q5 by currents $I/4$ which flow through the resistances R2 and R3. Thus, they are held at an equal potential.

The differential amplification transistors Q3 and Q5 are twice as large as the load transistors Q8 and Q9 (in the drawing indicated by A and 2A). This makes parasitic capacitances $C_{jp}$ and $C_{jn}$ being formed, respectively between the voltage source line and the connection node P10 of the transistors Q5 and Q9 and between the earth and the connection node P10, which is an output terminal of the operational amplifier 21 (FIG. 10).

The combined capacitance $C_T$ of the parasitic capacitances may be expressed by $C_{jp} + C_{jn}$ since the parasitic capacitances $C_{jp}$ and $C_{jn}$ are parallel to each other for an A.C. analysis. When it is operated at an intermediate voltage between the source voltage and the earth voltage, their voltage characteristics are cancelled. As shown in FIG. 11, it is operated as a stable earthing capacitance of which variation of voltage characteristic to input signal of 1 Vp-p is not larger than ±1%, and therefore an output signal $V_1$ high in SN ratio can be outputted to the next stage.

As a result, it is not necessary to connect any inner condenser having a capacitance about 10 times as large as the parasitic capacitance and having no voltage dependency. The condenser is conventionally required to be connected to the output terminal. Thus, it is possible to reduce the filter circuit in size and reduce power consumption to 1/10.

The second integrator 22 has a configuration similar to the first integrator 21, except that the intermediate potential $V_{EE}/2$ is supplied to the base of the differential amplification transistor Q5A through a transistor Q4A and a resistance R2A.

The output signal $V_2$ of the second integrator 22 is fed back to the base of the transistor Q6 of the first integrator 21 from a connection node P11.

Here, the connection node P12 between the base of the non-inverting input side transistor Q3 of the first integrator 21 and a diode D1 is connected to the base of the differential amplification transistor Q11 of the subtracter 23. The subtracter 23 is constituted by a current mirror differential amplification circuit for inputting input signals $V_{IN}$.

The connection node P13 between the base of the inverting input side transistor Q5 and a diode D2 is connected to the base of the differential amplification transistor Q12 and output signals $V_1$ and $V_2$ of the integrators 21 and 22 fed back.

The emitters of the differential amplification transistors Q11 and Q12 of the subtracter 23 are interconnected and are connected to a constant current source 26, which includes a transistor Q12 and a resistance R7. The collectors thereof are connected to collectors of transistors Q13 and Q14 as active loads.

Here, the connection node P14 between the transistors Q12 and Q14 is connected to a resistance R10 with one end thereof grounded for outputting an output signal $V_0$. The output signal $V_0$ is produced by subtracting the first and second output signals $V_1$ and $V_2$ from the input signal $V_{IN}$.

In the configuration above, input signals $V_{IN}$ are supplied to the base of the differential amplification transistor Q3 of the first integrator 21 through transistors Q1 and Q2 which are connected in parallel to the power line L.

Here, the base potential of the transistor Q3 increases as the potential of the input signals $V_{IN}$ raises. Therefore the collector current of the transistor Q3 which flows through the load transistor Q8 and the resistance R5 also increases.

In this event, the base potential of each of the transistors Q8 and Q9 which are base connected decreases as the current increases whereas the emitter current which flows through the load transistor Q9 decreases. Thus, the potential of the connection node P10 increases.

When the input signal $V_{IN}$ decreases in potential, the collector current of the transistor Q3 which flows through the load transistor Q8 and the resistance R5 decreases whereas the emitter current flowing through the load transistor Q9 increases. Thus, the connection node P10 increases in potential.

In this event, an output is obtained at the connection node P10 according to the increment of the input signal $V_{IN}$. An output signals $V_1$, which has no strain due to variation in capacitance and no strain to the input signal $V_{IN}$, is outputted to the next stage integrator 22. The ground capacitance $C_T$ includes the parasitic capacitances $C_{jp}$ and $C_{jn}$ and is held at a constant value irrespective of any potential variation of the connection node P10 (FIGS. 10 and 11).

In the second integrator 22, the output signal $V_1$ is accepted in the differential amplification transistor Q3A through the base of the transistor Q1A. An output in response to the increment of the output signal $V_1$ is fed back as an output signal $V_2$ to the first stage integrator 21 from the connection node P11.

In this event, output signals $V_1$ and $V_2$ are given to the connection node P13 of the inverting input terminal of the integrator 21 through the transistors Q4 and Q5 and resistances R2 and R3 (of resistance 2R). The voltage V- of the connection node P13 is given by the following equation:

$$V_- = \frac{r_e}{R + 3r_e/2} \cdot \frac{(\omega_0/Q)s + \omega_0^2}{s^2 + (\omega_0/Q)s + \omega_0^2} \cdot V_{IN} \quad (10)$$

where $r_e$ represents an emitter resistance and R represents the magnitude of the resistance R1.

An input signal $V_{IN}$ is given to the connection node P12 at the non-inverting input terminal through the transistors Q1 and Q2 connected in parallel and resistance R1 (of resistance R). The voltage V+ of the connection node P12 is given by the following equation:

$$V_+ = \frac{r_e}{R + 3r_e/2} \cdot V_{IN} \quad (11)$$

Thus, a current $\Delta i$ which flows from the differential amplification transistors Q11 to Q12 which constitute the subtracter 23 is given by the following equation, using the difference in potential between the connection nodes P12 and P13 and the mutual conductance $\frac{1}{2} r_e$:

$$\Delta i = \frac{1}{2r_e} \cdot \Delta V \quad (12)$$

The potential $V_0$ of the output terminal P14 of the subtracter 23 is expressed by the following equation:

$$V_0 = \frac{1}{2r_e} \cdot \frac{r_e}{R + 3r_e/2} \cdot \frac{s^2}{s^2 + (w_0/Q)s + w_0^2} \cdot V_{IN} \cdot R_L \quad (13)$$

where $R_L$ is a resistance of the resistance R10 of the output terminal.

Here, supposing $R + 3r_e/2 \approx R$, $R_L = 2R$, and $I1 = I2$, then the transmittance shown in Eq. (9) is obtained, and a high-pass filler which is of a capacity ground type to input signals $V_{IN}$ of output signals $V_0$ outputted from the integrator 23 is obtained.

According to the construction previously described, the grounding capacitance $C_T$ is connected to the output terminals P10 and P11 of the integrators 21 and 22, the grounding capacitances parasitic between the source voltage $V_{EE}$ and the ground potential. The output signal $V_1$ of the first stage integrator 21 and the output signal $V_2$ from the second stage integrator 22 are fed back to the first stage integrator 21 and are inputted to the inverting input terminal of the subtracter 23 which forms a differential couple with the input stage of the integrator 21. In this fashion, only a high frequency component of the input signal $V_{IN}$ may be passed through and outputted from the subtracter 23.

In the high-pass filter 20, the filter circuit is constituted using parasitic capacitances $C_{jn}$ and $C_{jp}$ which are parasitic on the output stage transistors Q5(Q5A) and Q9(Q9A) of the first and second integrators 21 and 22, respectively. Therefore, it is possible to reduce the power consumption and miniaturize the chip in size as compared to the conventional one.

Figure 12:
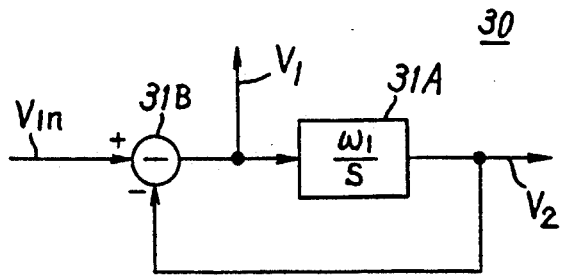
FIG. 12 is a block diagram for illustrating a filter circuit of the other embodiment.
Figure 13:
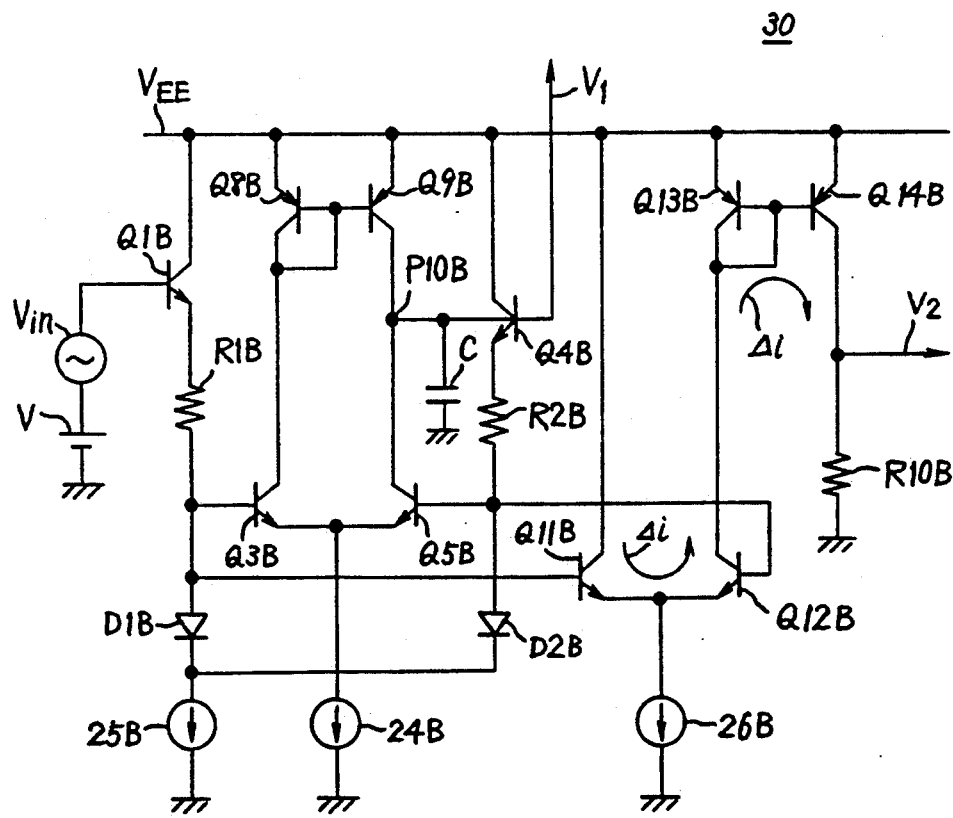
FIG. 13 is an interconnection diagram illustrating the equivalent circuit of the filter circuit of the other embodiment.

In the embodiment previously described, a case is described in which the capacity ground input type high-pass filter is constituted using two stage integrators 21 and 22. The present invention is not limited to this but may be applied to a capacity ground input type high-pass filter which is constituted by multiple stage integrators. As shown in FIGS. 12 and 13, the present invention may be applied to a case where a capacity ground type high-pass filter is constituted using a single stage integrator.

Here, FIG. 13 is -an equivalent circuit diagram of a high-pass filter shown in FIG. 12. The output $V_2$ outputted from the subtracter is given by subtracting the output signal $V_1$, which shown the characteristic of a low-pass filter, from the input signal $V_{IN}$ as shown by the following equation;

$$V_2 = \left(1 - \frac{\omega_1}{s + \omega_1}\right) \cdot V_{in} \tag{14}$$

In the foregoing embodiment, description is generally directed to the capacity ground high pass filter constituted. The present invention, however, is not limited to this. The present invention may be used as a band pass filter and a low-pass filter and may be widely applied to other various filter circuits.

Furthermore, in the preceding embodiment, a filter circuit is constructed, having the parasitic capacitance which is parasitic on transistors in the output stages of the integrators 21 and 22. The present invention is not restricted to this but may be widely applied to cases where capacitances of output stages are grounded.

Furthermore in the foregoing embodiment, to make the base potential of the differential amplification transistors Q3 and Q5 of the integrator 21 equal to each other, transistors Q1 and Q2 are connected in parallel to the base of the differential amplification transistor Q3 of the non-inverting input side. The inverting input side transistors Q4 and Q6 and the first and second emitter follower resistances R2 and R3 which are connected in parallel to the differential amplification transistor Q5 of the inverting input side are set twice (2R) as large as the non-inverting input side resistance R1. The present invention is not limited to this but may include various interconnections if the transistors Q3 and Q5 are equal in potential.

According to the present invention as described, the input stages of the first stage integrator and the subtracter are constituted by a differential couple. The parasitic capacitance which is parasitic on the first stage and the rear stage of the integrators is operated by an intermediate potential of the source voltage for obtaining an output signal with the integrators being constituted by differential amplification circuits. Output signals fed back from the first and the rear integrators are subtracted from an input signal by the subtracter to output the result. Therefore, various capacity ground filters may be constituted.

While there has been described in connection with the preferred embodiments of the invention, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. A filter circuit comprising:
    a plurality of integrators in the number of N, where $N \geq 2$ with at least a first integrator and a second integrator respectively having first and second differential amplification circuits connected in series with each other with an output of said first differential amplification circuit being input to said second differential amplification circuit; and
    a subtracter comprising a differential amplification circuit for subtracting output signals of said integrators from an input signal and for outputting the results of the subtraction as a filter output signal;
    wherein each integrator has a first stray capacitance formed between the output of said integrator and ground and a second stray capacitance formed between the output of said integrator and a power source.

2. A filter circuit according to claim 1, wherein:
    said integrators comprise initial stages, said initial stages of the integrators feedback each respective output signal through a respective resistor to an inverting input side of said first integrator, said respective resistor has a resultant resistance N times as large as a resistance connected to a non-inverting input side; and
    an input stage of the subtracter comprises a differential amplifier connected with an initial stage of the first integrator.

3. A filter circuit according to claim 1, wherein said first and second stray capacitances have offsetting voltage characteristics whereby the outputs of said integrators have a high signal to noise ratio.

4. A filter circuit as set forth in claim 1, wherein said filter circuit is a high pass filter circuit with said filter output signal only containing high frequency components of said input signal.

5. A filter circuit comprising:
    a first integrator comprising a first differential amplifier which receives an input signal at a non-inverting input;
    a second integrator comprising a second differential amplifier which receives an output of said first differential amplifier at a non-inverting input;
    the outputs of said first and second differential amplifiers being fed back to an inverting input of said first differential amplifier and being input to an inverting input of a subtracter; and
    said subtracter comprising a third differential amplifier for outputting the difference between said input signal received at a non-inverting input and said outputs of said first and second differential amplifiers received at an inverting input;
    wherein said filter circuit comprises a high pass filter circuit with an output of said subtracter only containing the high frequency components of said input signal.

6. A filter circuit according to claim 5, wherein each of said first and second integrators has a first stray capacitance connected between the output of said integrator and ground and a second stray capacitance connected between the output of said integrator and a power source.

7. A filter circuit according to claim 6, wherein said first and second stray capacitances have offsetting voltage characteristics whereby the outputs of said integrators have a high signal to noise ratio.

8. A filter circuit comprising:
a plurality of integrators in the number of N, where $N \geq 2$ with at least a first integrator and a second integrator respectively having a first and second differential amplification circuits connected in series with each other with an output of said first differential amplification circuit being input to said second differential amplification circuit; and
a subtracter comprising a differential amplification circuit for subtracting output signals of said integrators from an input signal and for outputting the results of the subtraction as a filter output signal;
wherein said filter circuit is a high pass filter circuit with said filter output signal only comprising the high frequency components of said input signal.

9. A filter circuit according to claim 8, wherein each integrator has a first stray capacitance formed between the output of said integrator and ground and a second stray capacitance formed between the output of said integrator and a power source.

10. A filter circuit according to claim 9, wherein said first and second stray capacitances have offsetting voltage characteristics whereby the outputs of said integrators have a high signal to noise ratio.

11. An integrator comprising:
first and second transistors forming a differential amplifier with an emitter of said first transistor connected to an emitter of said second transistor;
third and fourth transistors forming a load for said first and second transistors, wherein a collector of said third transistor is connected to a collector of said first transistor and a collector of said fourth transistor is connected to a collector of said second transistor; and
said first and second transistors are sized relative to said third and fourth transistors so that a first stray capacitance is formed between ground and said collector of said second transistor and a second stray capacitance is formed between a source of power and said collector of said fourth transistor;
wherein an input signal is received at a base of said first transistor and an integrated output signal is generated at said collector of said second transistor and wherein said first stray capacitance and said second stray capacitance are formed with offsetting voltage characteristics.

12. An integrator according to claim 11, wherein by forming said first stray capacitance and said second stray capacitance to have offsetting voltage characteristics, the output of said integrator has a high signal to noise ratio.

13. A filter circuit according to claim 11, wherein said first and second transistors are sized to be twice as large as said third and fourth transistors so that said first stray capacitance and said second stray capacitance are formed with offsetting voltage characteristics.

14. An integrator comprising:
first and second transistors forming a differential amplifier with an emitter of said first transistor connected to an emitter of said second transistor;
third and fourth transistors forming a load for said first and second transistors, wherein a collector of said third transistor is connected to a collector of said first transistor and a collector of said fourth transistor is connected to a collector of said second transistor;
a first parasitic capacitance formed between ground and said collector of said second transistor; and
a second parasitic capacitance formed between a source of power and said collector of said fourth transistor;
wherein an input signal is received at a base of said first transistor and an integrated output signal is generated at said collector of said second transistor and said first and second transistors are sized to be twice as large as said third and fourth transistors so that said first parasitic capacitance and said second parasitic capacitance are formed with offsetting voltage characteristics.

15. An integrator as set forth in claim 14, wherein said integrated output signal has a higher signal to noise ratio as a result of said offsetting voltage characteristics.

* * * * *